(12) United States Patent
Park et al.

(10) Patent No.: US 9,224,429 B2
(45) Date of Patent: Dec. 29, 2015

(54) THREE-DIMENSIONAL SEMICONDUCTOR DEVICES AND METHODS OF FABRICATING THE SAME

(71) Applicants: Jintaek Park, Hwaseong-si (KR); Kohji Kanamori, Seoul (KR); Youngwoo Park, Seoul (KR); Jaeduk Lee, Seongnam-si (KR)

(72) Inventors: Jintaek Park, Hwaseong-si (KR); Kohji Kanamori, Seoul (KR); Youngwoo Park, Seoul (KR); Jaeduk Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/635,588

(22) Filed: Mar. 2, 2015

(65) Prior Publication Data

US 2015/0170714 A1    Jun. 18, 2015

Related U.S. Application Data

(62) Division of application No. 14/152,440, filed on Jan. 10, 2014, now Pat. No. 9,019,739.

(30) Foreign Application Priority Data

Jan. 11, 2013 (KR) .................. 10-2013-0003277

(51) Int. Cl.
*G11C 5/02* (2006.01)
*H01L 27/115* (2006.01)
(Continued)

(52) U.S. Cl.
CPC *G11C 5/025* (2013.01); *G11C 7/02* (2013.01); *G11C 7/18* (2013.01); *H01L 27/11573* (2013.01); *H01L 27/11582* (2013.01); *G11C 7/1039* (2013.01)

(58) Field of Classification Search
USPC ............................................. 365/51
See application file for complete search history.

(56) References Cited

U.S. PATENT DOCUMENTS 7,927,926 B2  4/2011  Katsumata et al.
8,008,732 B2  8/2011  Kiyotoshi et al.
(Continued)

FOREIGN PATENT DOCUMENTS

JP    2009-283799 A    12/2009
JP    2011-114235 A     6/2011
(Continued)

OTHER PUBLICATIONS

Hung et al. "A Highly Scalable Vertical Gate (VG) 3D NAND Flash with Robust Program Disturb Immunity Using a Novel PN Diode Decoding Structure", Symposium on VLSI Technology Digest of Technical Papers, 2011.
(Continued)

*Primary Examiner* — Hoai V Ho
*Assistant Examiner* — Pablo Huerta
(74) *Attorney, Agent, or Firm* — Harness, Dickey & Pierce, P.L.C.

(57) ABSTRACT

According to example embodiments of inventive concepts, a three-dimensional semiconductor device may include: a memory cell array including memory cells that may be arranged three-dimensionally, the memory cell array including a left side opposite a right side, and a top side opposite a bottom side in a plan view; at least one word line decoder adjacent to at least one of the left and right sides of the memory cell array; a page buffer adjacent to the bottom side of the memory cell array; and a string selection line decoder adjacent to one of the top and bottom sides of the memory cell array.

18 Claims, 22 Drawing Sheets

(51) Int. Cl.
*G11C 7/02* (2006.01)
*G11C 7/18* (2006.01)
*G11C 7/10* (2006.01)

(56) References Cited

U.S. PATENT DOCUMENTS

| | | | |
|---|---|---|---|
| 8,148,789 | B2 | 4/2012 | Kito et al. |
| 8,188,517 | B2 | 5/2012 | Choi |
| 8,208,279 | B2 | 6/2012 | Lue |
| 2008/0073635 | A1 | 3/2008 | Kiyotoshi et al. |
| 2009/0108333 | A1 | 4/2009 | Kito et al. |
| 2010/0207193 | A1 | 8/2010 | Tanaka et al. |
| 2010/0226195 | A1* | 9/2010 | Lue ............... H01L 27/0688 365/230.06 |
| 2010/0327323 | A1 | 12/2010 | Choi |
| 2011/0033995 | A1 | 2/2011 | Katsumata et al. |
| 2011/0049611 | A1 | 3/2011 | Kiyotoshi et al. |
| 2011/0169067 | A1 | 7/2011 | Ernst et al. |
| 2011/0169072 | A1 | 7/2011 | Lim et al. |
| 2011/0266604 | A1 | 11/2011 | Kim et al. |
| 2011/0298013 | A1 | 12/2011 | Hwang et al. |
| 2012/0007167 | A1* | 1/2012 | Hung ............... H01L 27/0688 257/324 |
| 2012/0012920 | A1 | 1/2012 | Shin et al. |
| 2012/0051137 | A1 | 3/2012 | Hung et al. |
| 2012/0052674 | A1 | 3/2012 | Lee et al. |
| 2012/0068241 | A1 | 3/2012 | Sakuma et al. |
| 2012/0068254 | A1 | 3/2012 | Sakuma et al. |
| 2012/0236642 | A1* | 9/2012 | Lue ............... H01L 27/0688 365/185.05 |
| 2013/0250683 | A1* | 9/2013 | Hosono ............... G11C 16/0483 365/185.05 |
| 2013/0270626 | A1* | 10/2013 | Lue ............... H01L 27/0688 257/324 |
| 2013/0322172 | A1* | 12/2013 | Shim ............... G11C 11/5628 365/185.03 |

FOREIGN PATENT DOCUMENTS

| | | |
|---|---|---|
| KR | 20100069391 A | 6/2010 |
| KR | 10-1091023 B1 | 12/2011 |
| KR | 10-1103607 B1 | 1/2012 |
| KR | 10-1112431 B1 | 2/2012 |
| KR | 10-1117589 B1 | 2/2012 |

OTHER PUBLICATIONS

Kim et al. "Multi-Layered Vertical Gate NAND Flash Overcoming Stacking Limit for Terabit Density Storage", Symposium on VLSI Technology Digest of Technical Papers, 2009.

Chang, et al. "Memory Architecture of 3D Vertical Gate (3DVG) NAND Flash Using Plural Island-Gate SSL Decoding Method and Study of It's Program Inhibit Characteristics", Institute of Electrical and Electronics Engineers, 2012.

\* cited by examiner

THREE-DIMENSIONAL SEMICONDUCTOR DEVICES AND METHODS OF FABRICATING THE SAME

CROSS-REFERENCE TO RELATED APPLICATIONS

This U.S. non-provisional patent application is a divisional of U.S. application Ser. No. 14/152,440 filed on Jan. 10, 2014 and claims priority under 35 U.S.C. §119 to Korean Patent Application No. 10-2013-0003277, filed on Jan. 11, 2013, in the Korean Intellectual Property Office. The entire contents of each of the above-referenced applications are hereby incorporated by reference.

BACKGROUND

Example embodiments of inventive concepts relate to a semiconductor device, and for example, to three-dimensional semiconductor devices and/or methods of fabricating the same.

In semiconductor devices, increased integration may be an important factor in realizing a high performance and/or a low cost device. Currently, in a two-dimensional memory semiconductor device or in a planar memory semiconductor device, integration may be affected by forming a fine pattern, since integration may determine an area that a unit memory cell occupies. However, equipment used to form a fine pattern may be expensive so economic factors may limit increasing integration of a two-dimensional memory semiconductor device. Thus, three-dimensional memory devices (e.g., three-dimensionally arranged memory cells) are being developed.

SUMMARY

Example embodiments of inventive concepts relate to a three-dimensional semiconductor memory device with an increased page depth.

Example embodiments of inventive concepts relate to a three-dimensional semiconductor memory device capable of reducing a parasitic resistance of an active pattern thereof.

Example embodiments of inventive concepts relate to a fabricating method capable of reducing a capacitive coupling between word lines of a three-dimensional semiconductor memory device.

Example embodiments of inventive concepts relate to a fabricating method capable of improving a data retention property of a three-dimensional semiconductor memory device.

According to example embodiments of inventive concepts, a three-dimensional semiconductor device may include: a memory cell array including memory cells that may be arranged three-dimensionally, the memory cell array including a left side opposite a right side, and a top side opposite a bottom side in a plan view; at least one word line decoder adjacent to at least one of the left and right sides of the memory cell array; a page buffer adjacent to the bottom side of the memory cell array, and a string selection line decoder adjacent to one of the top and bottom sides of the memory cell array.

In example embodiments, the string selection line decoder may be between the memory cell array and the page buffer.

In example embodiments, the memory cell array may be between the string selection line decoder and the page buffer.

In example embodiments, the device may further include: a plurality of bit lines crossing the memory cell array and connected to the page buffer; a plurality of string selection lines crossing the memory cell array and connected to the string selection line decoder; and a plurality of word lines crossing the memory cell array and connected to a corresponding one of the at least one word line decoder. The plurality of bit lines and the plurality of string selection lines may cross the plurality of word lines.

In example embodiments, the memory cell array may include a plurality of blocks arranged along a longitudinal direction of the plurality of bit lines, and each of the blocks may include a plurality of sectors arranged along a longitudinal direction of the plurality of word lines.

In example embodiments, the memory cell array may include block selection lines in the plurality of blocks, respectively, and the block selection lines may be configured to control electric connections between the plurality of bit lines and block units of the memory cells.

In example embodiments, the memory cell array may include active patterns. The active patterns may have a multi-layered and a multi-column structure. In each of the plurality of blocks, the active patterns of two different sectors of the plurality of sectors may be separated from each other in the longitudinal direction of the plurality of word lines.

In example embodiments, the device may further include: a plurality of bit line contact plugs, each being configured to connect one of the plurality of bit lines electrically to a corresponding one of the layers in a corresponding one of the active patterns. An adjacent pair of the plurality of blocks may share some of the plurality of bit line contact plugs.

In example embodiments, a number of the plurality of bit line contact plugs in each of the sectors may be half a number of the layers of the active patterns in each of the sectors.

In example embodiments, the device may further include a plurality of bit line contact plugs, each being configured to connect one of the plurality of bit lines electrically to a corresponding one of the plurality of layers of the active patterns. An adjacent pair of the plurality of blocks may be connected to the plurality of bit lines through different bit line contact plugs among the plurality of bit line contact plugs.

In example embodiments, a number of the plurality of bit line contact plugs may be equal to a number of the layers in the plurality of active patterns in each of the plurality of sectors.

In example embodiments, the memory cell array may include: active patterns including a multi-layered and a multi-column structure; word lines crossing the active patterns and having a multi-column structure; and a charge storing layer between the active patterns and the word lines.

In example embodiments, the memory cell array may include active patterns, the active patterns may have a multi-layer and a multi-column structure, each of the active patterns may be a semiconductor pattern, whose longitudinal axis may be parallel to a substrate, and each of the plurality of word lines may include vertical gates between the active patterns and a horizontal line connecting the vertical gates.

In example embodiments, each of the plurality of bit lines may be electrically connected to a corresponding one of the active patterns, and each of the string selection lines may be configured to control electric connections between the plurality of bit lines and a corresponding column in one of the active patterns.

In example embodiments, the device may further include low resistance layers connected to the layers, respectively, of the plurality of active patterns, and bit line contact plugs connecting each of the bit lines electrically to a corresponding one of the low resistance layers. A resistivity of the low resistance layers may be lower than a resistivity of the plurality of active patterns.

In example embodiments, an adjacent pair of the plurality of blocks may share one of the low resistance layers, and at least one replacement opening may vertical penetrate the low resistance layers.

In example embodiments, the device may further include bit line contact plugs connecting each of the bit lines electrically to a corresponding one of the layers of the active patterns. The bit line contact plugs may be substantially a same distance from one of the plurality of word lines.

According to example embodiments of inventive concepts, a three-dimensional semiconductor device may include: active patterns having a multi-layered and a multi-column structure; word lines having a multi-column structure, the word lines crossing the active patterns; and string selection gates configured to control the columns of the active patterns, respectively. The string selection gates include first gates located at a first distance and second gates located at a second distance, the second distance being smaller than the first distance, when measured from a most adjacent one of the word lines that may be located closest to the string selection gates, and the most adjacent word line may include a plurality of first extended portions extending toward the first gates.

In example embodiments, the device may further include a block selection line spaced apart from the most adjacent word line by the string selection gates, and the block selection line may include second extended portions protruding toward the second gates.

In example embodiments, the string selection gates may be on the columns of the active patterns.

In example embodiments, the string selection gates may be between the columns of the active patterns.

According to example embodiments of inventive concepts, a method of fabricating a three-dimensional semiconductor device may include forming active patterns having a multi-layered and a multi-column structure; forming a memory layer having a multi-layered structure to cover the active patterns; forming word lines having a multi-column structure, the word line crossing the active patterns; and etching at least a portion of the memory layer exposed between the word lines.

In example embodiments, the memory layer may include a tunnel insulating layer, a charge storing layer, and a blocking insulating layer that may be sequentially stacked, and the etching of at least a portion of the memory layer may remove at least one of the tunnel insulating layer, the charge storing layer, and the blocking insulating layer from between the word lines.

In example embodiments, the method may further include: forming an insulating gapfill layer between the word lines after the etching of at least the portion of the memory layer. The insulating gapfill layer may define an air-gap between the word lines and the active patterns.

According to example embodiments of inventive concepts, a method of fabricating a three-dimensional semiconductor device may include forming active patterns having a multi-layered and a multi-column structure, forming word lines having a multi-column structure, the word lines crossing the active patterns, and forming an insulating gapfill layer between the word lines. The insulating gapfill layer may define an air-gap between the word lines and the active patterns.

In example embodiments, each of the word lines may include: vertical gates between the columns of the active patterns, the vertical gates facing sidewalls of the active patterns; and a horizontal line connecting the vertical gates to each other in a direction crossing the active patterns. The air-gap may be locally formed between the vertical gates.

According to example embodiments of inventive concepts, a three-dimensional semiconductor device may include: a memory cell array including memory cells that are stacked on top of each other, the memory cell array including a left side opposite a right side, and a top side opposite a bottom side in a plan view; at least one word line decoder adjacent to at least one of the left and right sides of the memory cell array; a page buffer adjacent to one of the bottom and top sides of the memory cell array; and a string selection line decoder adjacent to one of, the one of the bottom and top sides of the memory cell array, or a different one of the bottom and top sides of the memory cell array.

In example embodiments, the device may include: a plurality of string selection gates; a plurality of bit lines crossing the memory cell array and connected to the page buffer; a plurality of string selection lines crossing the memory cell array in a direction parallel to the plurality of bit lines and connected to the string selection line decoder; a plurality of word line crossing the memory cell array and connected to the at least one word line decoder. Blocks units of the memory cell array may include a plurality of active pattern layers stacked vertically on top of each other. Each one of the plurality of active pattern layers may include columns that extend in the direction parallel to the plurality of bit lines and define spaces between the columns. Each one of the word lines may include a plurality of vertical portions that extend vertically through the spaces between the columns in the plurality of active pattern layers. Each one of the string selection gates may be configured to control a connection between one of the plurality of bit lines and one of the columns in one of the plurality of active pattern layers.

In example embodiments, the device may include a plurality of bit line contact plugs, and each one of the plurality of bit line contact plugs may be configured to connect the plurality of bit lines to a corresponding one of the active pattern layers.

In example embodiments, an adjacent pair of blocks units in the memory cell array may share some of the plurality of bit line contact plugs in common.

In example embodiments, one of the plurality of word lines crossing each block unit of the memory cell array may be a dummy word line that includes extended portions that extend perpendicular from the dummy word line and alternate with non-extended portions of the dummy word line. The string selection gates may include a first group of string selection gates spaced apart from the extended portions of the dummy word line and a second group of string selection gates spaced apart from the non-extended portions of the dummy word line in each block unit of the memory cell array, and the first group of string selection gates and the second group of string selection gates may be arranged in a zig zag pattern in the plan view.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
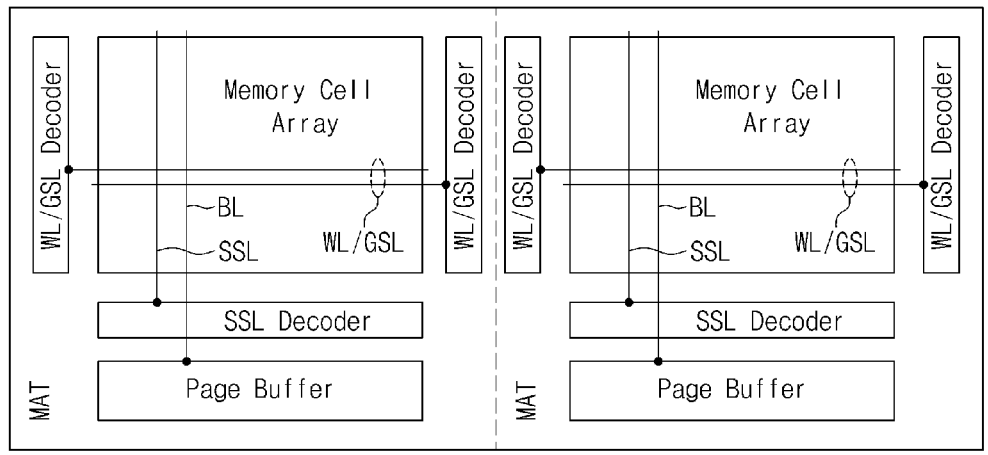
FIGS. 1 through 4 are schematic chip layout diagrams depicting three-dimensional semiconductor memory devices according to example embodiments of inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which some example embodiments are shown. Example embodiments of inventive concepts may, however, be embodied in many different forms and should not be construed as being limited to the embodiments set forth herein; rather, these example embodiments of inventive concepts are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1 through 4 are schematic chip layout diagrams depicting three-dimensional semiconductor memory devices according to example embodiments of inventive concepts. FIG. 5 is a schematic diagram illustrating a memory cell array of a three-dimensional semiconductor memory device according to example embodiments of inventive concepts.

Referring to FIGS. 1 through 4, a three-dimensional semiconductor memory device may include at least one mat MAT. Each mat MAT may include a memory cell array provided with three-dimensionally arranged memory cells, word lines WL configured to control the memory cells, bit lines BL selectively connected to the memory cells, string selection lines SSL selectively controlling electric connections between the bit lines BL and the memory cells, and ground selection lines GSL controlling electric connections between the memory cells and the common source line. The memory cell array may include a plurality of blocks BLOCK 0, . . . , m, as shown in FIG. 5. The word lines WL may be provided to cross at least one of the blocks BLOCK 0, . . . , m, and the bit lines BL may be provided on every the blocks BLOCK 0, . . . , m. As shown in FIG. 5, the plurality of blocks BLOCK 0, . . . , m, may be arranged along a longitudinal direction BLD of the plurality of bit lines. Each of the plurality of blocks BLOCK 0, . . . , m, may include a plurality of sectors arranged along a longitudinal direction WLD of the word lines. In example embodiments, the bit lines BL of each of the blocks may be operated in an independent manner.

As will be described with reference to FIGS. 6 through 15, the bit lines BL, and the string selection lines SSL may be disposed to cross the word lines WL and the ground selection lines GSL. In each mat MAT, the bit lines BL may be connected to at least one page buffer, and the word lines WL and the ground selection lines GSL may be connected to at least one pair of WL/GSL decoders facing each other. Further, the string selection lines may be connected to a SSL decoder.

Figure 2:
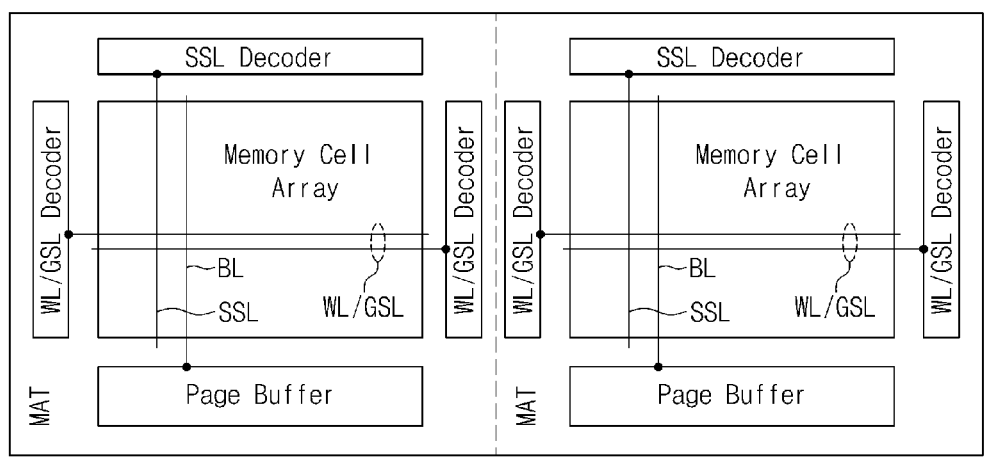
Figure 3:
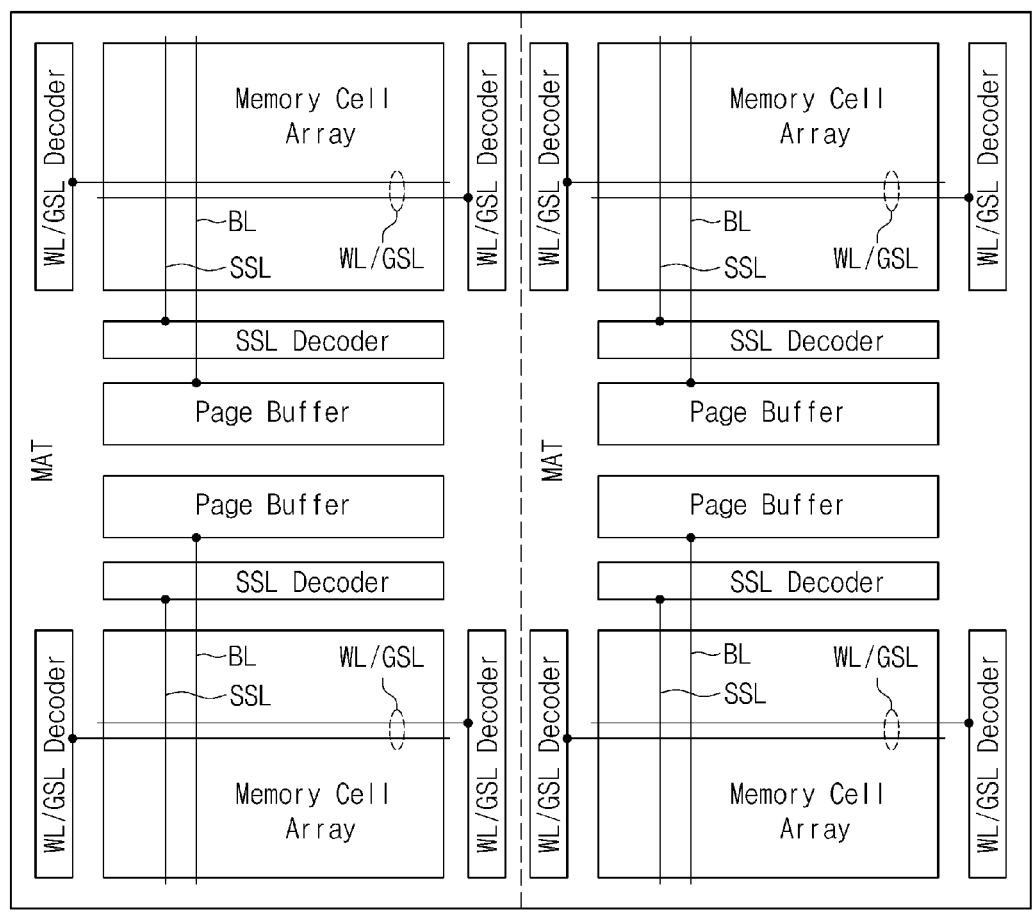
Figure 4:
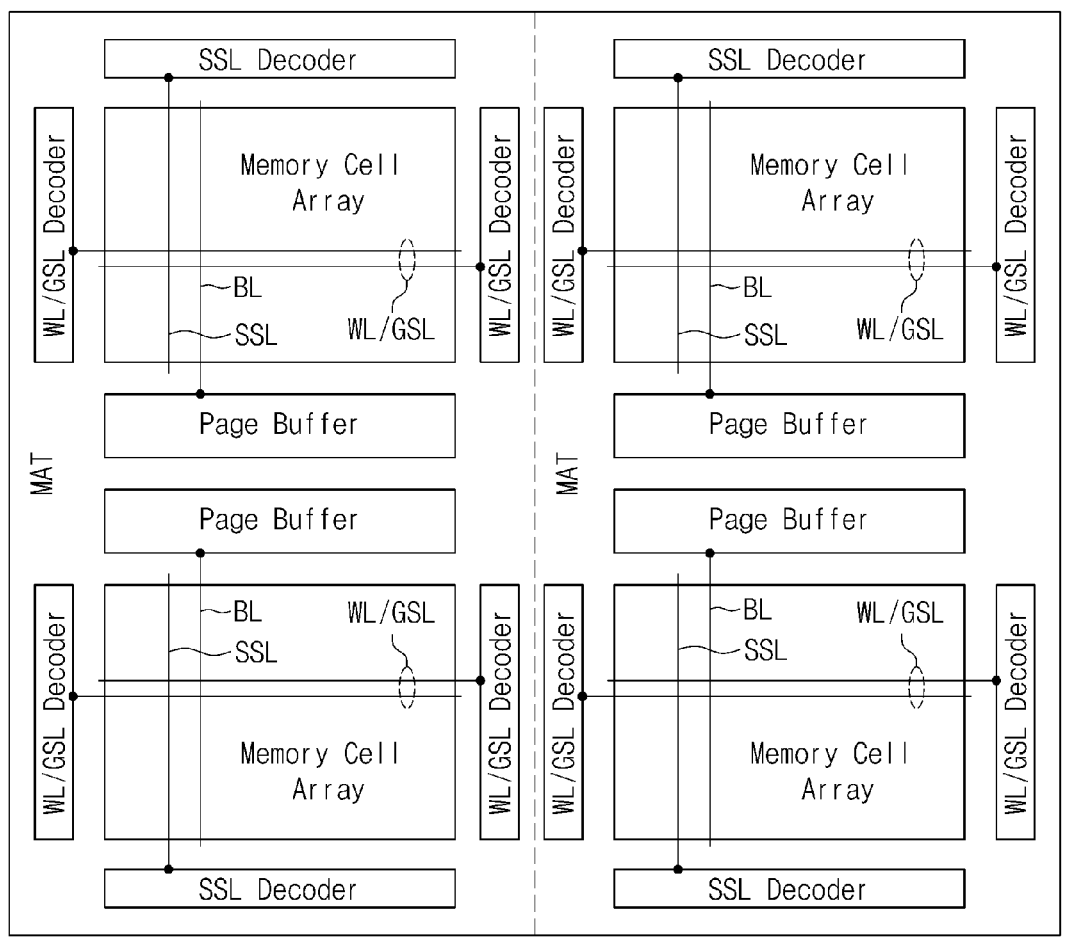
Figure 5:
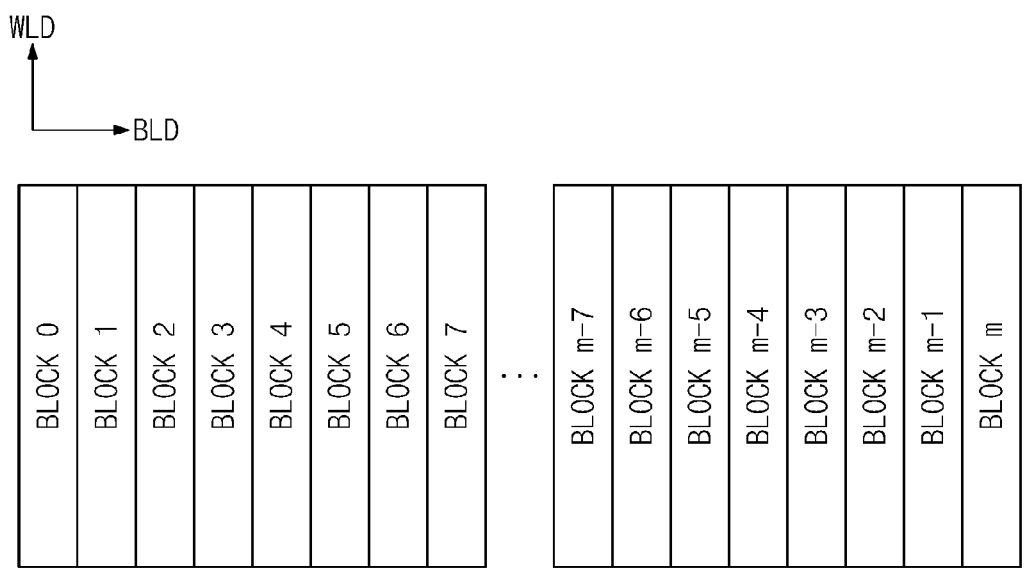
FIG. 5 is a schematic diagram illustrating a memory cell array of a three-dimensional semiconductor memory device according to example embodiments of inventive concepts.

As shown in FIGS. 1 through 4, each mat MAT may include a pair of the WL/GSL decoders facing each other. In example embodiments, in each mat MAT, the SSL Decoder may be disposed adjacent to the page buffer or at a side of the memory cell array facing the page buffer. For example, as shown in FIGS. 1 and 3, in each mat MAT, the SSL Decoder may be provided between the page buffer and the memory cell array. Alternatively, as shown in FIGS. 2 and 4, in each mat MAT, the memory cell array may be provided between the SSL Decoder and the page buffer facing each other.

These configurations of the SSL decoder make it possible to increase a page depth of a three-dimensional semiconductor memory device up to a level desired by the user. For example, in the case where the SSL decoder is disposed adjacent to the WL/GSL decoders, the page depth of the device may be given by dividing a distance L between the bit line and the common source line by a pitch P of the string selection line SSL, e.g., L/P. However, according to configurations of the SSL decoder shown in FIGS. 1 through 4, three-dimensional semiconductor memory devices according to example embodiments may be free from the above limitation, and thus, it may be configured to have an increased page depth, as described above. Furthermore, in the case where the SSL decoder is disposed adjacent to the WL/GSL decoders, the string selection lines SSLs may have different lengths from each other, because, for example, the string selection transistors may not be arranged parallel to a direction of the SSL decoder. However, according to example embodiments shown in FIGS. 1 through 4, this problem can be solved.

Figure 11:
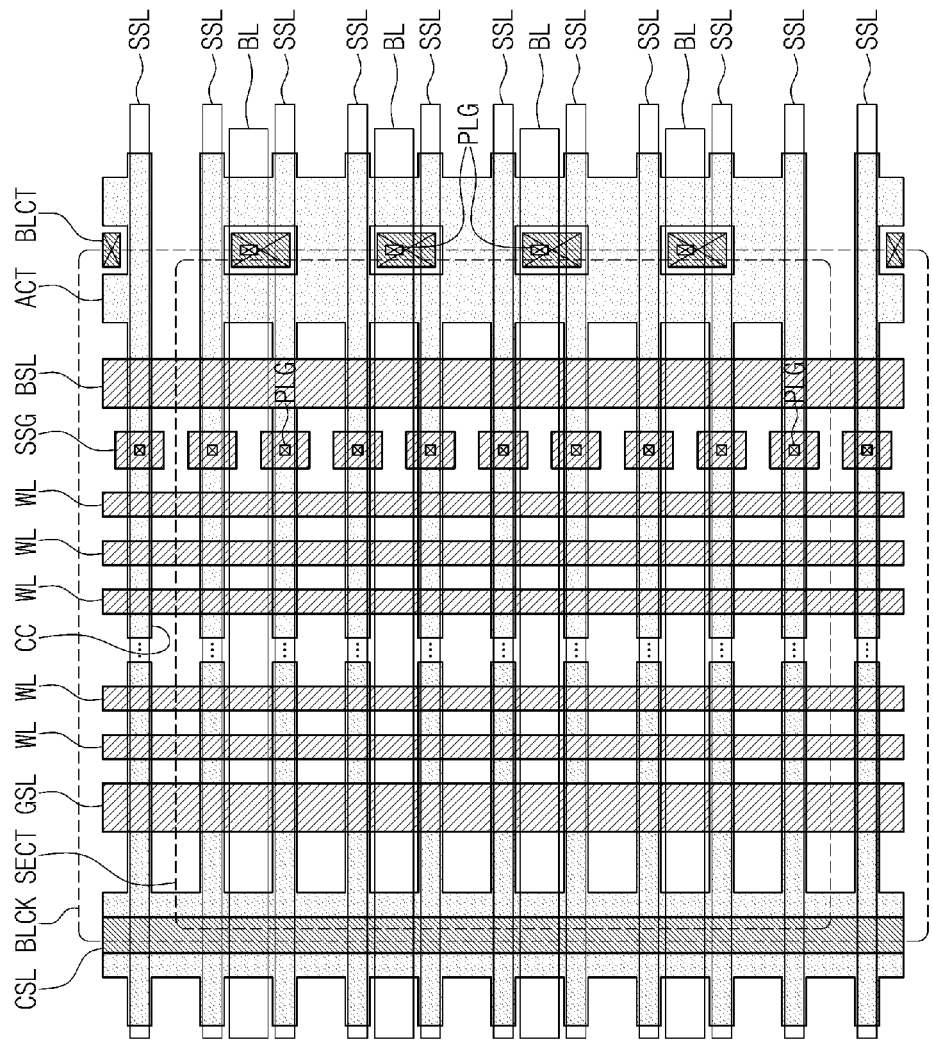
Figure 12:
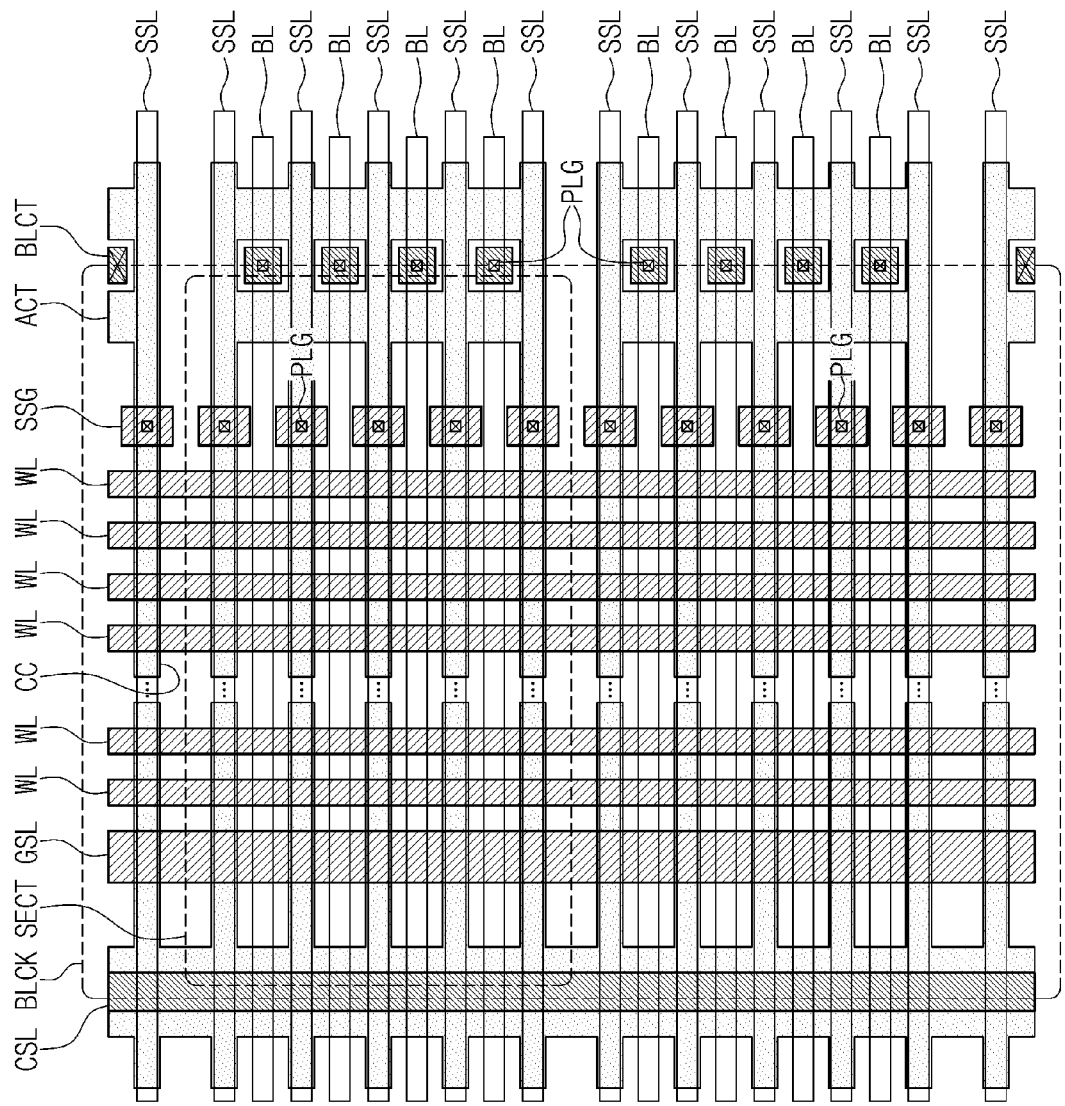
Figure 13:
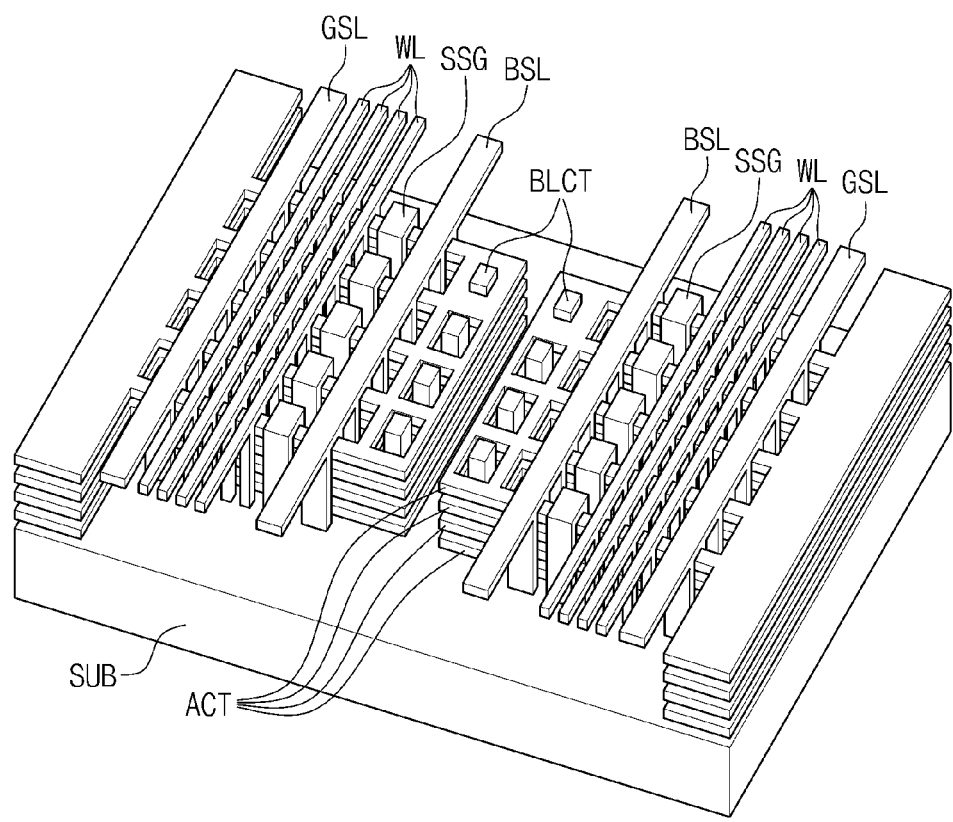
FIGS. 13 through 15 are perspective views illustrating memory cell arrays of three-dimensional semiconductor memory devices, according to example embodiments of inventive concepts.
Figure 14:
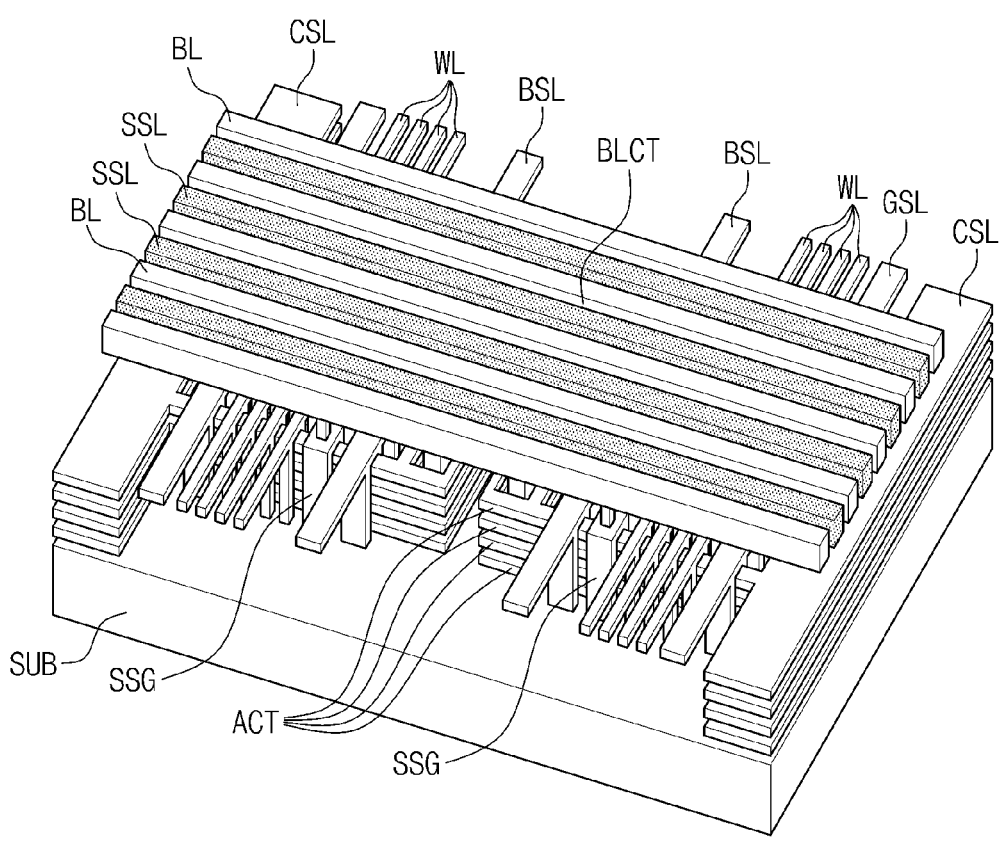
Figure 15:
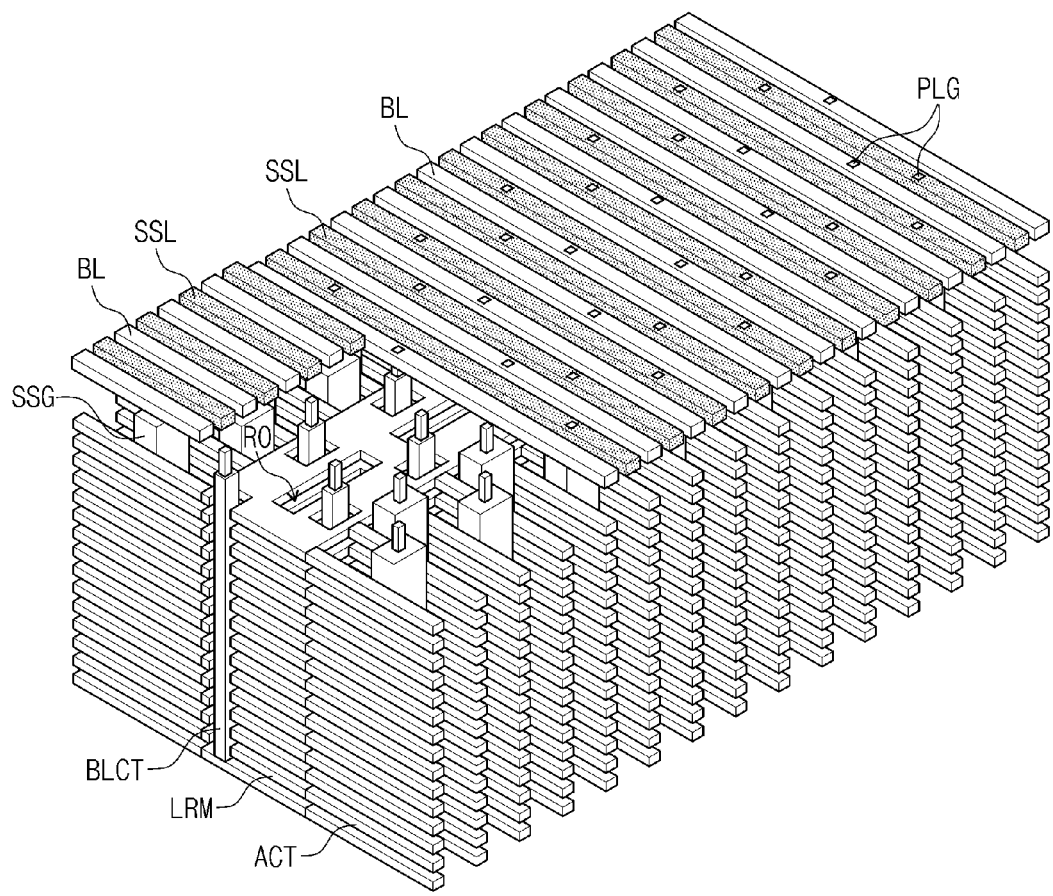

FIGS. 6 through 12 are plan views illustrating memory cell arrays of three-dimensional semiconductor memory devices, according to example embodiments of inventive concepts, and FIGS. 13 through 15 are perspective views illustrating memory cell arrays of three-dimensional semiconductor memory devices, according to example embodiments of inventive concepts. Each of the blocks BLOCK 0, . . . , m of FIG. 5 may include at least one portion that is configured to have structural features that will be described with reference to FIGS. 6 through 12. FIGS. 13 through 15, which are presented to provide better understanding of example embodiments of inventive concepts, show structural features of the sector SECT that will be described below.

Figure 16:
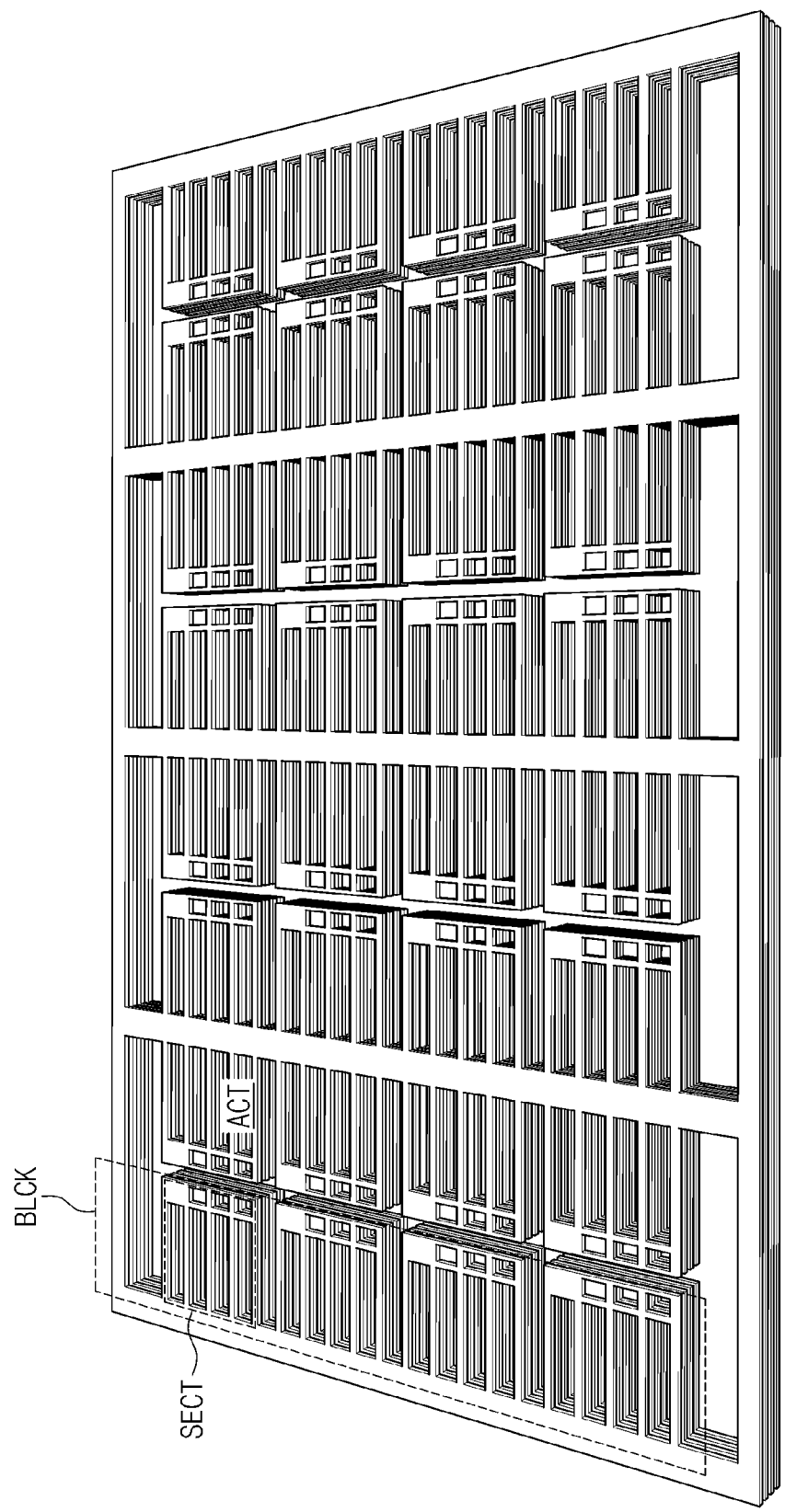
FIG. 16 is a perspective view illustrating active patterns of a three-dimensional semiconductor memory device, according to example embodiments of inventive concepts.

Referring to FIGS. 6 through 12, each block BLCK may include a plurality of sectors SECT. Each of the sectors SECT may include a plurality of active patterns ACT that are arranged to have a multi-layered and multi-column structure, as shown in FIGS. 13, 15, and 16. The active patterns ACT may be formed of one of semiconductor materials (e.g., silicon or graphene). In each block BLCK, a plurality of the sectors SECT may share one common source line CSL. Furthermore, the common source line CSL may be shared by a pair of the blocks BLCK arranged adjacent to each other. In other words, the pair of the blocks BLCK arranged adjacent to each other may be provided to have mirror symmetry with respect to the common source line CSL.

Each sector SECT may include a plurality of bit line contact plugs BLCT. As shown in FIGS. 13, 15, and 16, each of the bit line contact plugs BLCT may be electrically connected to a corresponding one layer of the active patterns ACT. In each sector SECT, some of the active patterns ACT arranged at the same level may be connected, in common, to a corresponding one of the bit line contact plugs BLCT.

Each sector SECT may include a plurality of string selection gates SSG. For example, as shown in FIG. 13, each of the string selection gates SSG may be configured to control a corresponding one of columns of the active patterns ACT on a substrate SUB. In this case, in each sector SECT, electric connections between ones of the active patterns ACT, which are arranged in the same column, and the bit line contact plugs BLCT may be controlled by a corresponding one of the string selection gates SSG.

The bit line contact plugs BLCT may be connected to a plurality of the bit lines BL, respectively, which cross the blocks BLCK, the string selection gates SSG may be connected to the string selection lines SSL, respectively, crossing the blocks BLCK. In example embodiments, the bit lines BL may be disposed between the string selection lines SSL. For example, the bit lines BL and the string selection lines SSL may be arranged alternatingly. In example embodiments, the bit lines BL and the string selection lines SSL may be disposed at the same level, as shown in FIGS. 14 and 15. However, example embodiments are not limited thereto, and the bit lines BL may be formed at a different level from the string selection lines SSL.

Each block BLCK may include a plurality of word lines WL crossing the sectors SECT. In example embodiments, a memory element (e.g., a multilayered structure for a charge storing) may be provided between the word lines WL and the active patterns ACT. Each of the word lines WL may include vertical gates extending between the columns of the active patterns ACT and a gate connection line crossing the sectors SECT and connecting the vertical gates to each other. For example, each of the word lines WL may be shaped like a comb.

Each block BLCK may include the ground selection line GSL crossing the sectors SECT. At least one ground gate insulating layer may be provided between the ground selection line GSL and the active patterns ACT to server as a gate dielectric. In example embodiments, the ground gate insulating layer may have the same thin-film structure as that of the memory element. Furthermore, the ground selection line GSL may be formed to have substantially the same sectional structure as that of each of the word lines WL. For example, the ground selection line GSL may also be shaped like a comb. The ground selection line GSL may be formed to have a width greater than that of each of the word lines WL.

In example embodiments, each block BLCK may include low resistance layers LRM connecting the active patterns ACT with the bit line contact plugs BLCT, as shown in FIGS. 6 through 9. The low resistance layers LRM may be arranged to have a multi-layered structure, and each of them connects ones of the active patterns ACT arranged at the same column to a corresponding one of the bit line contact plugs BLCT. The low resistance layers LRM may be formed of a material (e.g., metals or highly doped semiconductor), whose resistivity is smaller than that of the active patterns ACT.

The low resistance layers LRM may be formed using a horizontal replacement process. For example, the horizontal replacement process may include forming a replacement opening RO to expose the sidewalls of the active patterns ACT, horizontally etching the exposed sidewalls of the active patterns ACT to form recess regions of a multi-layered structure, and then, filling the recess regions with a low resistance material.

Figure 6:
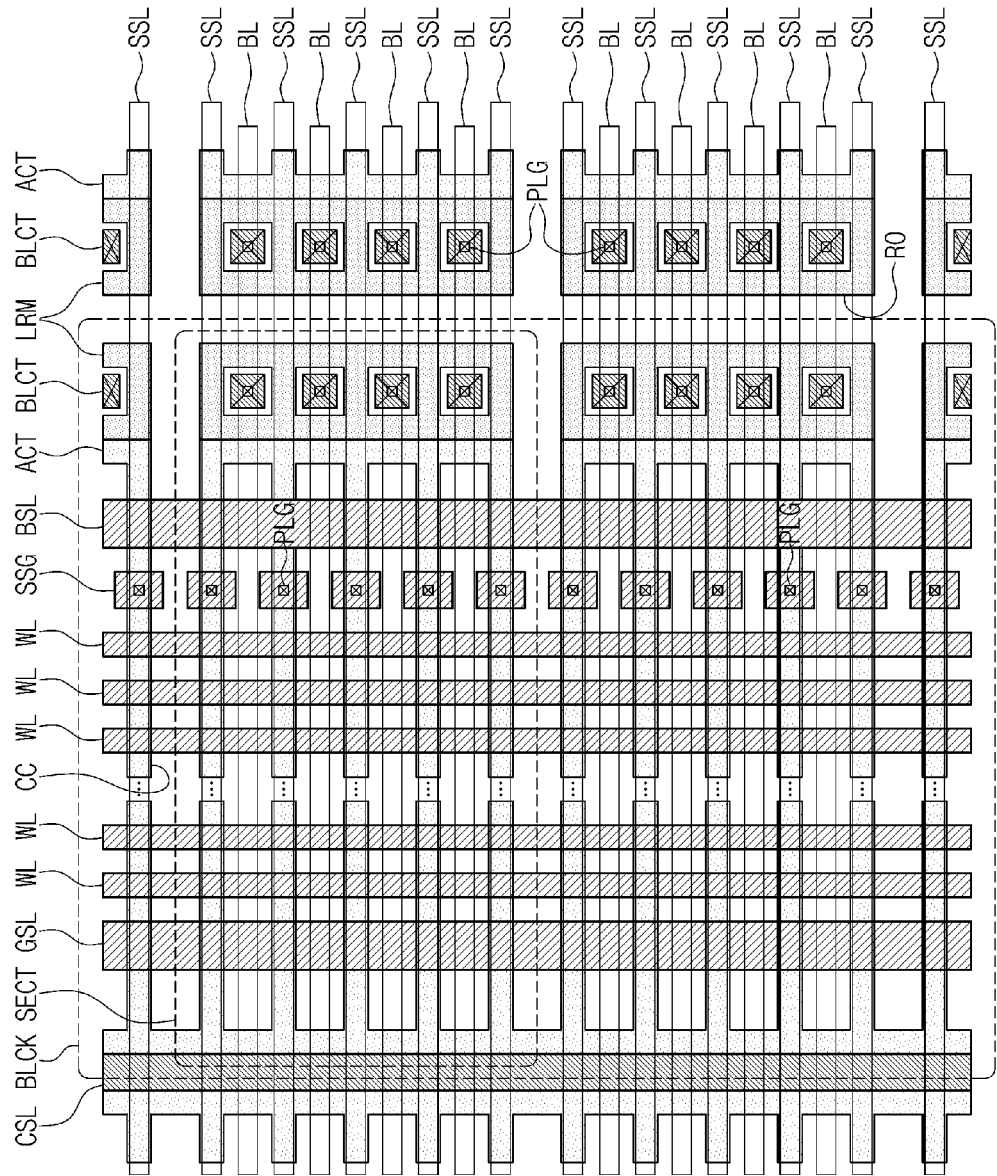
FIGS. 6 through 12 are plan views illustrating memory cell arrays of three-dimensional semiconductor memory devices, according to example embodiments of inventive concepts.
Figure 7:
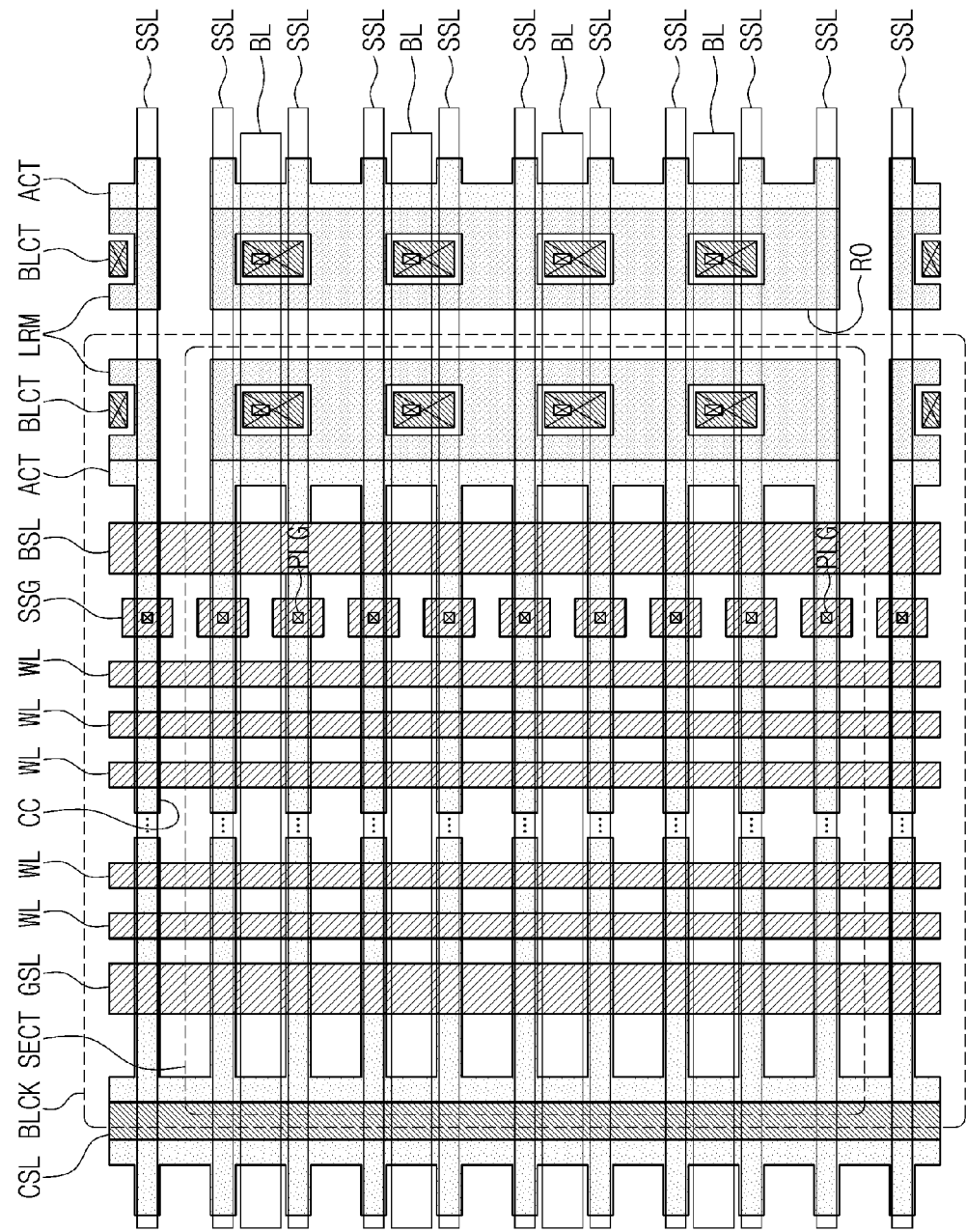
Figure 8:
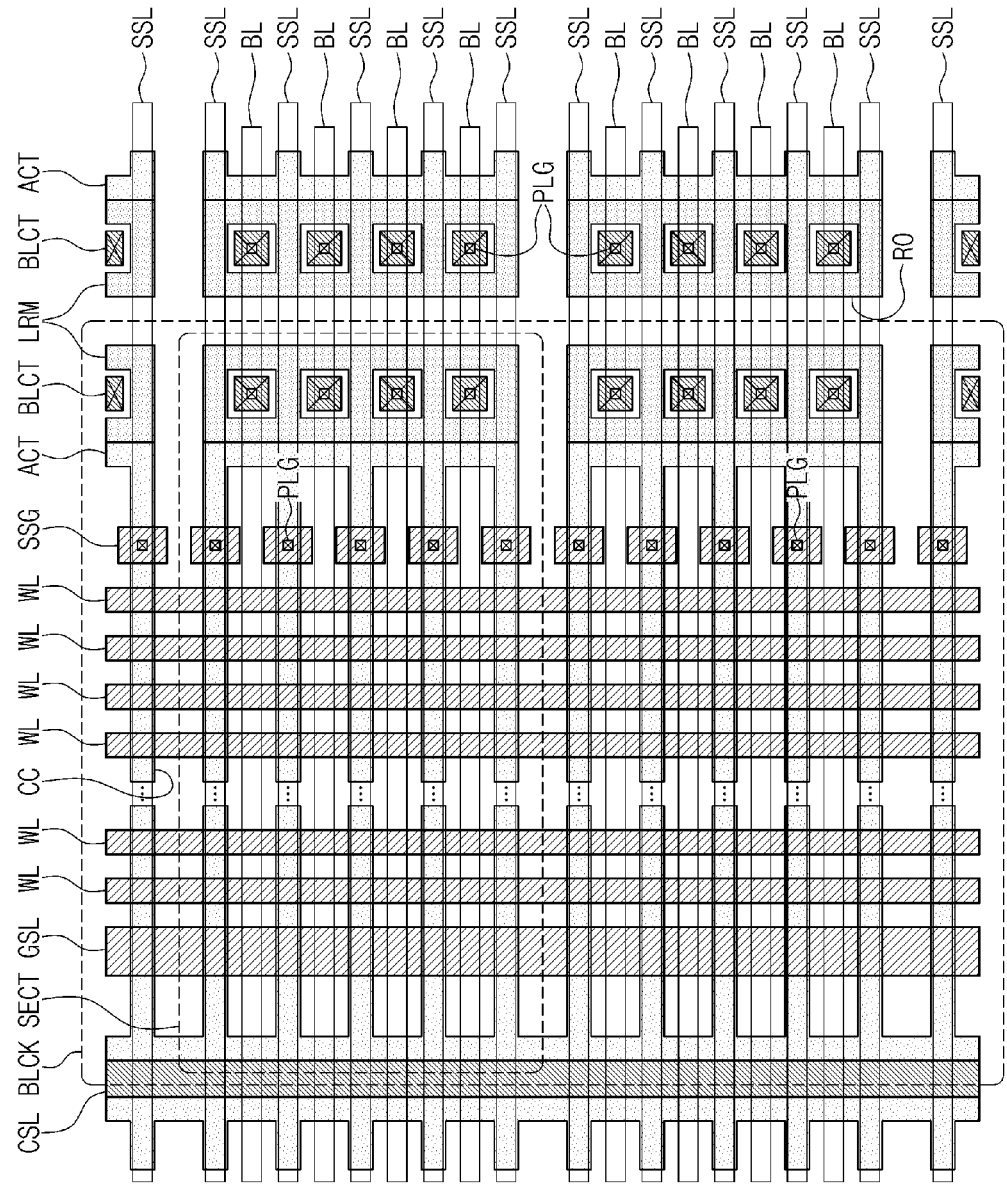

The replacement opening RO may be formed to cross each of the sectors SECT from end to end. For example, as shown in FIGS. 6 through 8, the low resistance layers LRM or the active patterns ACT, in an adjacent pair of the sectors SECT, may be horizontally separated into a plurality of portions.

Figure 9:
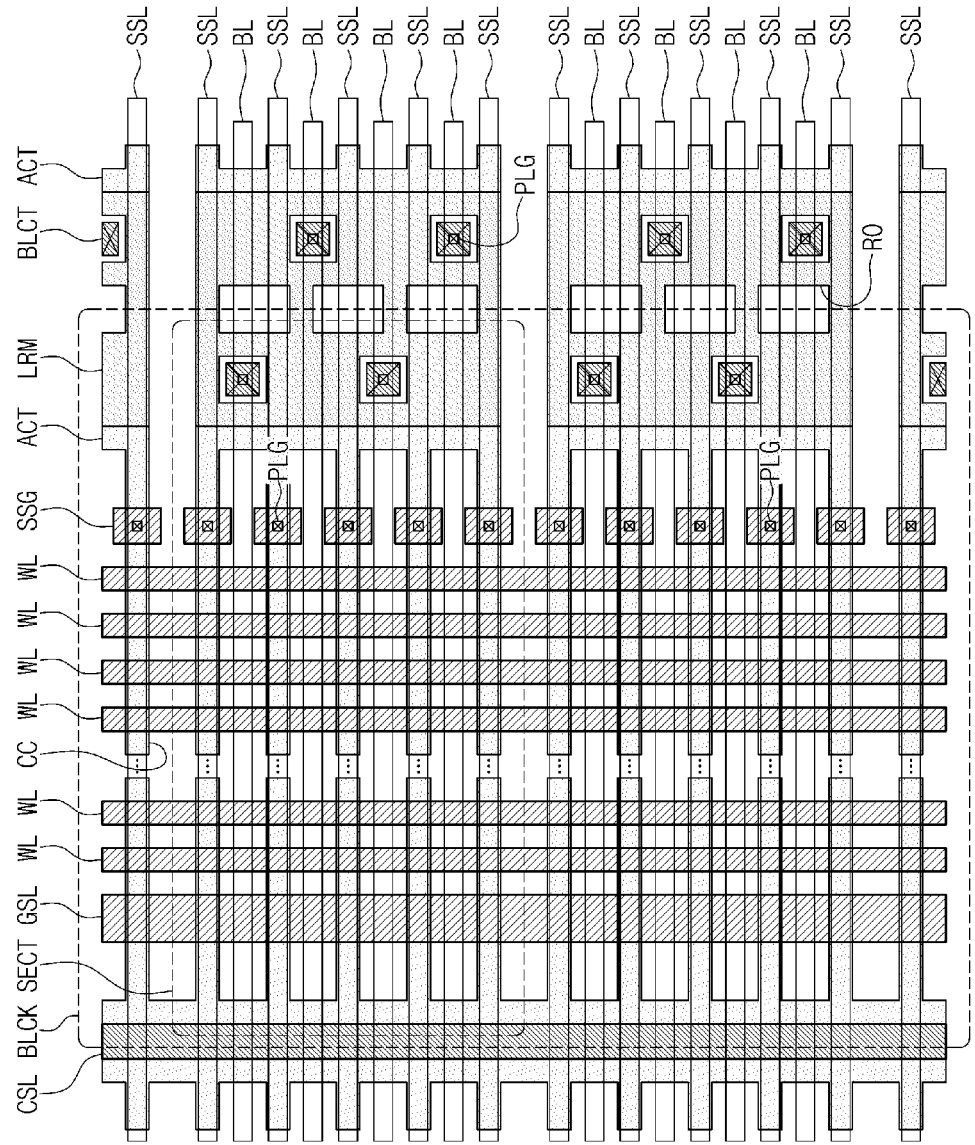

In example embodiments, the replacement opening RO may be formed not to cross each of the sectors SECT. For example, as shown in FIG. 9, the replacement opening RO may be formed to penetrate the low resistance layers LRM. In this case, the adjacent pair of the sectors SECT may share the low resistance layers LRM.

Figure 10:
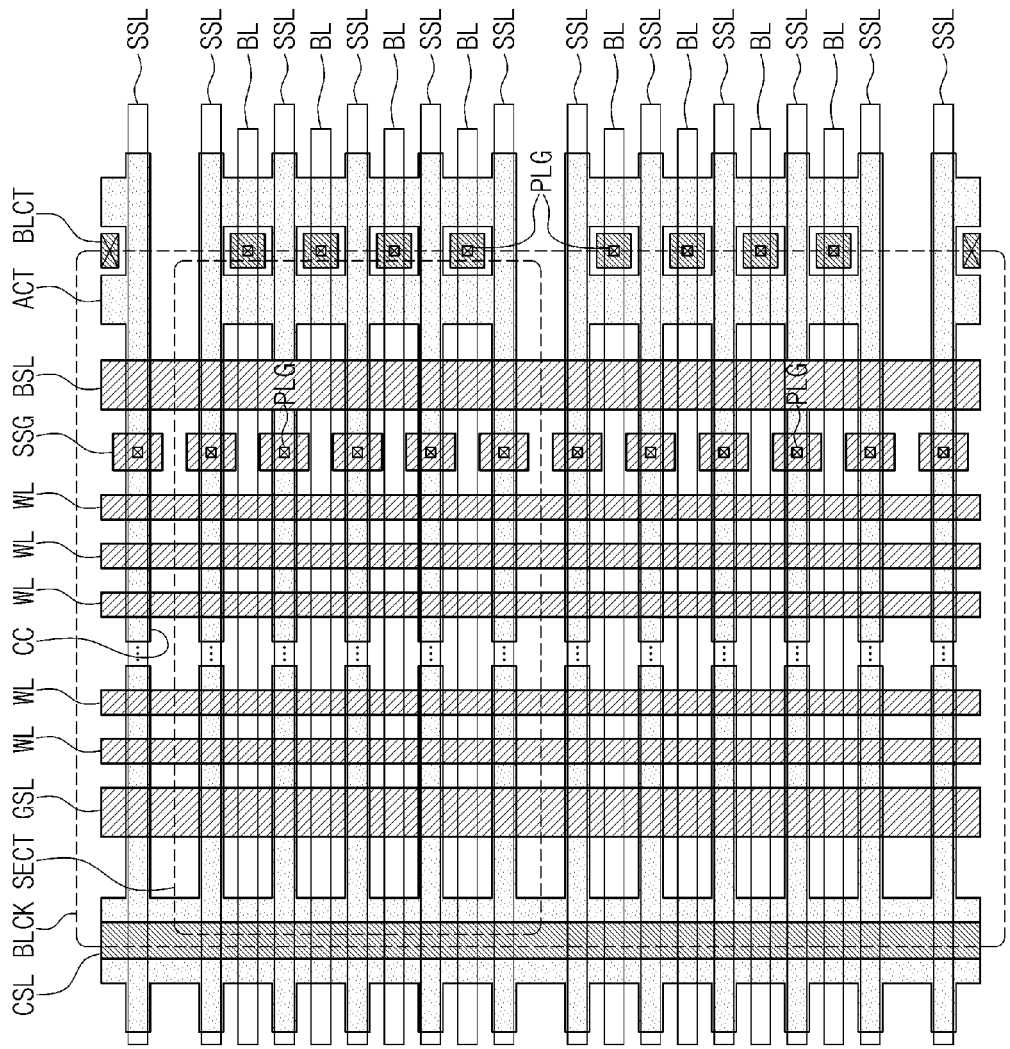

In example embodiments, as shown in FIGS. 10 through 12, each of the sectors SECT may be configured not to include the low resistance layers LRM. For example, the active patterns ACT may be directly connected to the bit line contact plugs BLCT. In this case, as shown in FIG. 9, the adjacent pair of the sectors SECT may share the bit line contact plugs BLCT. In other words, for the semiconductor devices shown in FIGS. 9 through 12, voltages to be transmitted through the bit line contact plugs BLCT may be applied in common to the adjacent pair of the sectors SECT.

Meanwhile, as shown in FIG. 15, the bit lines BL and the string selection lines SSL may be electrically connected to the bit line contact plugs BLCT and the string selection gates SSG through plugs PLG. To provide better understanding of example embodiments of inventive concepts, positions to be connected to the plugs PLG are depicted at a right portion of FIG. 15, but the plugs PLG may be veiled by the bit lines BL and the string selection lines SSL, as shown at a left portion of FIG. 15.

According to example embodiments of inventive concepts, in each sector SECT, each of the bit lines BL and each of the bit line contact plugs BLCT may be connected to one of layers of the active patterns ACT, thereby serving as a layer selector. Accordingly, in each sector SECT, the number of the bit lines BL and the number of the bit line contact plugs BLCT may be the same as the layer number of the active patterns ACT. For example, in FIGS. 6 through 12, four bit lines BL may be provided to cross over each sector SECT if a layer number of the active patterns ACT is 4, as shown in FIG. 13. However, example embodiments of inventive concepts are not limited thereto. For example, in FIGS. 9 through 12, bit line contact plugs BLCT are shared by an adjacent pair of the sectors SECT, and a number of the bit line contact plugs BLCT provided within each sector SECT may be half the number of the bit lines BL crossing over each sector SECT.

In example embodiments, in each sector SECT, each of the string selection gates SSG and each of the string selection lines SSL may be connected to one of columns of the active patterns ACT, thereby serving as a column selector. For example, as shown in FIGS. 6 through 12, the number of the string selection lines SSL crossing over each sector SECT, may be equivalent to the column number of the active patterns ACT constituting each sector SECT.

During program or reading operations, the column selector may be used to select one of the columns of the active patterns ACT constituting each sector SECT. In other words, one of the columns of the active patterns ACT can be selected by selecting one of the string selection lines SSL.

In the meantime, during program or reading operations, a plurality of the sectors SECT constituting each block BLCK may be controlled by different bit lines BL and different string selection lines SSL, and they can be independently operated. This makes it possible to increase a size of data (e.g., page) to be input/output at a time to/from each block BLCK. For example, in the case where each of the blocks BLCK is not separated into a plurality of sectors, the maximum size of a page may be limited to the layer number of the active patterns ACT. By contrast, according to example embodiments described with reference to FIGS. 6 through 12, the maximum size of the page may be the product of the layer number of the active patterns ACT and the number of the sectors SECT constituting each block BLCK.

In example embodiments, as shown in FIGS. 6, 7, 10, and 11, each of the blocks BLCK may include at least one block selection line BSL that is configured to control electric connections between the bit lines BL and the active patterns ACT. One of the blocks BLCK may be selectively accessed by using the block selection lines BSL, but example embodiments of inventive concepts are not limited thereto. For example, as shown in FIGS. 8, 9, and 12, example embodiments of inventive concepts may be configured not include the block selection line BSL, and in this case, electric connections between the bit lines BL and the active patterns ACT may be controlled using the word lines WL.

In example embodiments, as shown in FIGS. 6, 8, 10, and 12, the bit lines BL and the string selection lines SSL may be alternatingly arranged. This means that, when measured along a longitudinal direction of the word line WL, the bit line contact plugs BLCT may be provided to have substantially the same pitch as that of the active patterns ACT. However, this structural feature may be variously modified. For example, in the case where an adjacent pair of the blocks BLCK shares the bit line contact plugs BLCT that are arranged in a zigzag manner, as shown in FIG. 9, the bit line contact plugs BLCT may have a pitch that is greater than that of the active patterns ACT. Furthermore, in each sector SECT, the column number of the active patterns ACT may be greater than that of the bit lines BL, as shown in FIGS. 7 and 11. For example, in each sector SECT, the column number of the active patterns ACT may be about an integer multiple of the number of the bit lines BL, but example embodiments of inventive concepts may not be limited thereto. In this case, the bit line contact plugs BLCT may have a pitch that is greater than that of the active patterns ACT.

Figure 17:
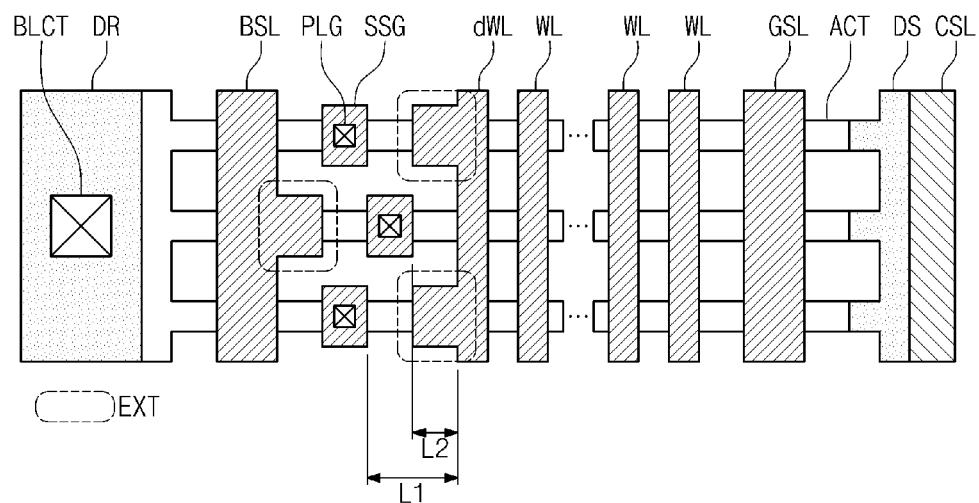
FIGS. 17 and 18 are plan views illustrating a memory cell array of a three-dimensional semiconductor memory device, according to example embodiments of inventive concepts.
Figure 18:
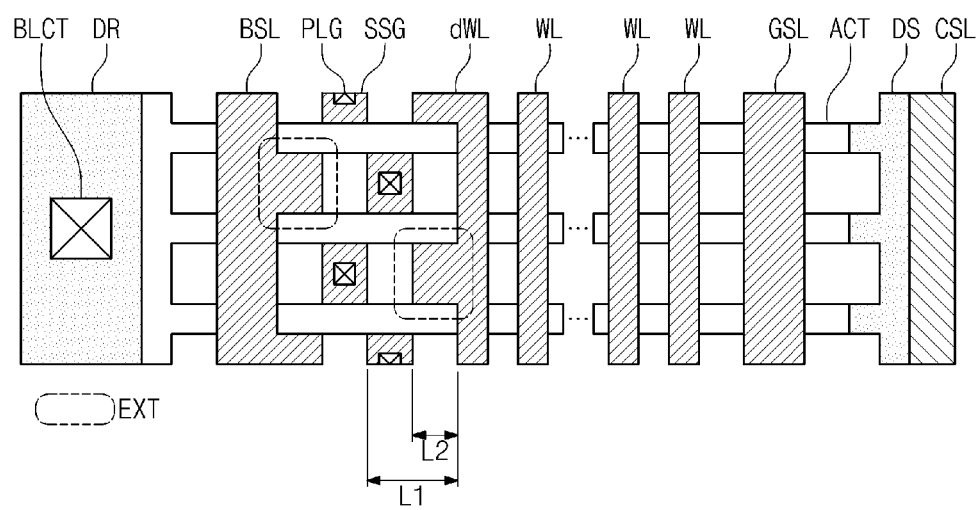

FIGS. 17 and 18 are plan views illustrating a memory cell array of a three-dimensional semiconductor memory device, according to example embodiments of inventive concepts.

As shown in FIG. 17, the string selection gates SSG may be provided to have a zigzag arrangement. For example, when the string selection gates SSG may be grouped into a first group controlling even-numbered columns of the active patterns ACT and a second group controlling odd-numbered columns of the active patterns ACT, and the first and second groups may be different from each other in terms of distances from the most adjacent one of the word lines WL (hereinafter, a dummy word line dWL) or from the block selection line BSL to the string selection gates SSG. If a distance between the string selection gates SSG and the dummy word line dWL of the first group is L1, a distance between the string selection gates SSG and the dummy word line dWL of the second group is L2 that is smaller than L1. This distance difference may lead to an increase in resistance of electric paths passing through the active patterns ACT. The bit line contact plugs BLCT and common source line CSL may be connected to the active patterns ACT via a drain diffusion region DR and a source diffusion region DS, respectively. The drain diffusion region DR and the source diffusion region DS may have a conductivity type that is different from that of the active pattern ACT.

According to example embodiments of inventive concepts, the dummy word line dWL and/or the block selection line BSL may have extended portions EXT horizontally extending toward the string selection gates SSG, as shown in FIGS. 17 and 18. In example embodiments, each of the extended portions EXT may have a width that is given by L1-L2, but example embodiments of inventive concepts may not be limited thereto. The extended portions EXT make it possible to prevent an increased electric resistance of the active patterns ACT, which may result from the zigzag arrangement of the string selection gates SSG.

In example embodiments, as shown in FIG. 18, the string selection gates SSG may be arranged between the columns of the active patterns ACT. In this case, each of the columns of the active patterns ACT may be controlled by a pair of the string selection gates provided at both sides thereof.

Figure 19:
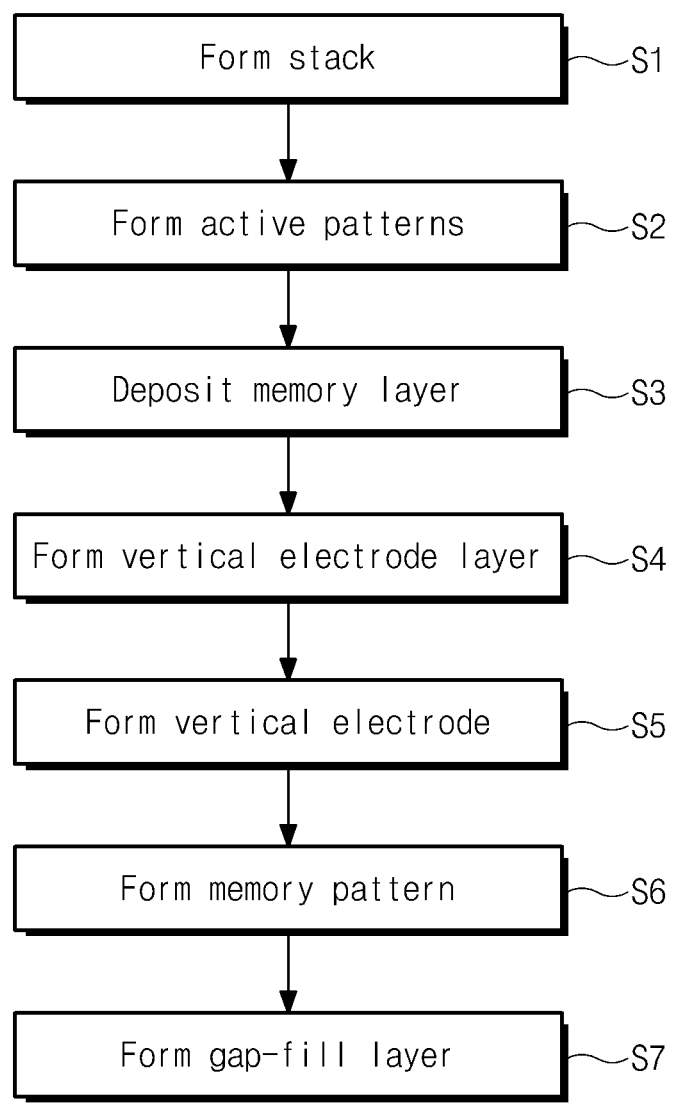
FIG. 19 is a flow chart illustrating a method of fabricating a three-dimensional semiconductor memory device according to example embodiments of inventive concepts.
Figure 20:
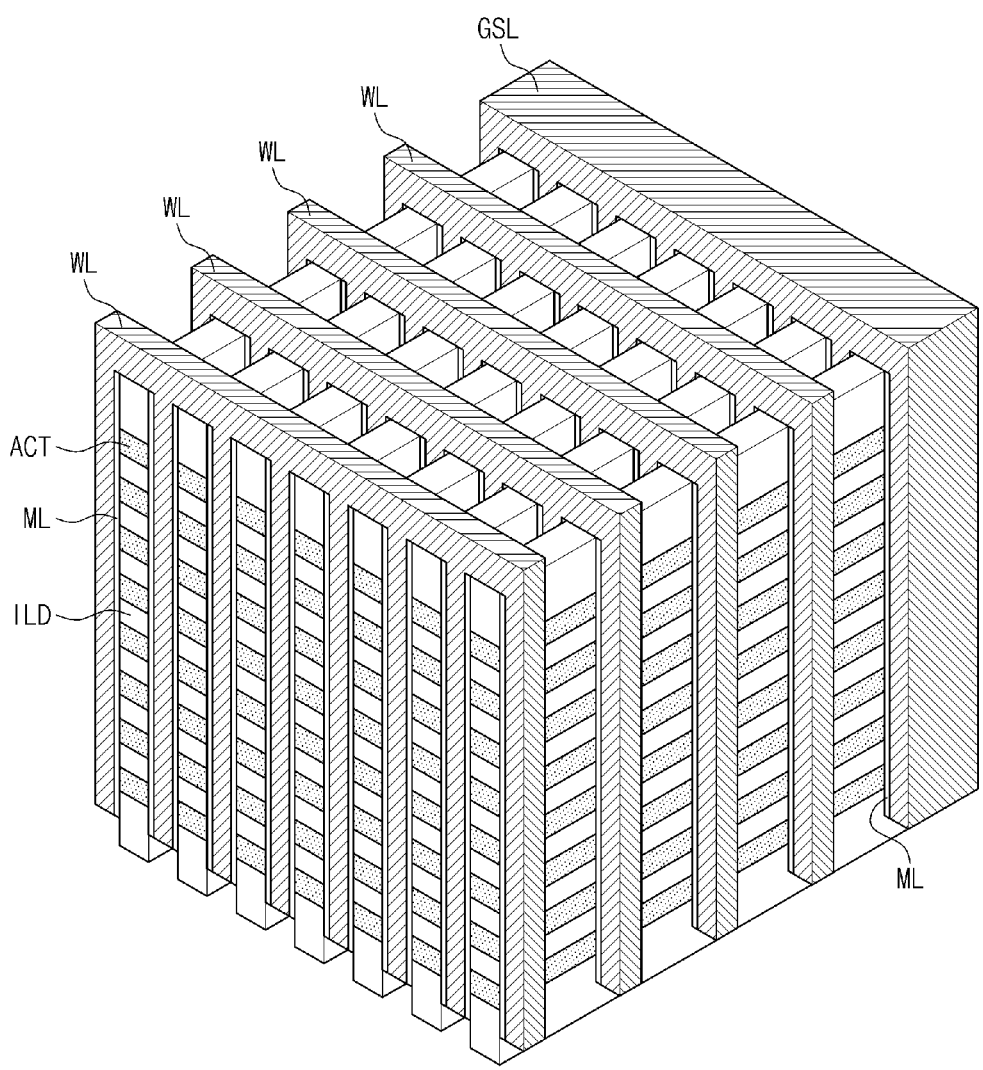
FIG. 20 is a perspective view illustrating a three-dimensional semiconductor memory device according to example embodiments of inventive concepts, which is fabricated using the fabricating method of FIG. 19.

FIG. 19 is a flow chart illustrating a method of fabricating a three-dimensional semiconductor memory device according to example embodiments of inventive concepts, and FIG. 20 is a perspective view illustrating a three-dimensional semiconductor memory device according to example embodiments of inventive concepts, which is fabricated using the fabricating method of FIG. 19. Additionally, FIG. 21 is an enlarged view of a portion of the three-dimensional semiconductor memory device in FIG. 20.

Figure 21:
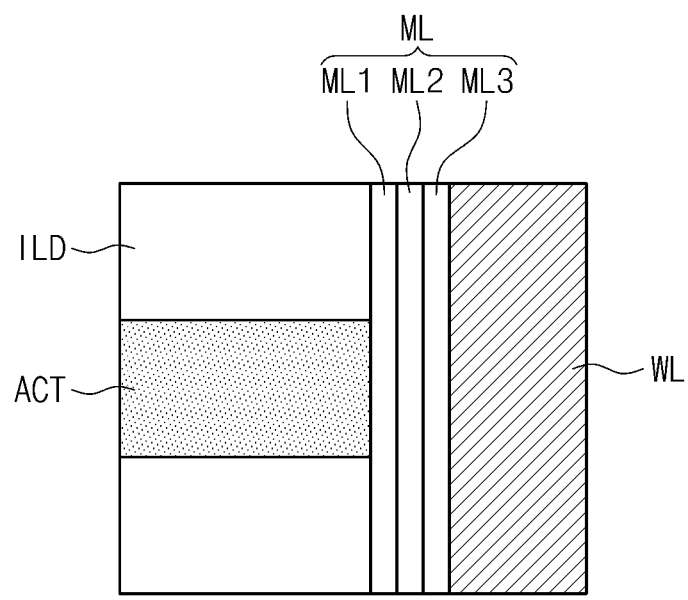
FIG. 21 is an enlarged view of a portion of the three-dimensional semiconductor memory device in FIG. 20.

Referring to FIGS. 19 to 21, a stack including a plurality of insulating layers and a plurality of semiconductor layers may be formed (in S1). The stack may be patterned to form channel cutting regions CC defining active patterns ACT (in S2). In example embodiments of inventive concepts, the active patterns ACT may be patterned to have the structural features shown in, for example, FIG. 16.

A memory layer may be formed to cover conformally a resulting structure provided with the active patterns ACT (in S3). In example embodiments of inventive concepts, the memory layer may include a tunnel insulating layer, a charge storing layer, and a blocking insulating layer. For example, the charge storing layer may include a silicon nitride layer, and the blocking insulating layer may include at least one of a silicon oxide layer or high-k dielectrics (such as, aluminum oxide, hafnium oxide, or zirconium oxide). As shown in FIG. 21, the memory layer ML may include a tunnel insulating layer ML1, a charge storing layer ML2, and a blocking insulating layer ML3.

A vertical electrode layer may be formed on the memory layer to fill the channel cutting regions (in S4). The vertical electrode layer may include at least one of a doped polysilicon layer, a titanium nitride layer, a tantalum nitride layer, or a tungsten nitride layer.

Thereafter, the vertical electrode layer may be patterned to form vertical electrodes (in S5). The vertical electrodes may be used as at least one of the ground selection lines GSL, the word lines WL, the string selection gates SSG, or the block selection lines BSL that were described with reference to FIGS. 6 through 15. For example, the formation of the vertical electrodes may include forming a mask pattern to cross the active patterns ACT and anisotropically etching the vertical electrode layer using the mask pattern as an etch mask. Accordingly, the vertical electrodes may be horizontally separated from each other, and a surface of the memory layer may be partially exposed between the vertical electrodes. For example, each of the vertical electrodes may be shaped like a comb including portions extending between the columns of the active patterns ACT, as shown in FIG. 20.

Thereafter, the memory layer exposed between the vertical electrodes may be etched using, for example, an isotropic etching process, to form memory patterns MP (in S6). Next, an insulating gapfill layer GFL may be formed between the vertical electrodes to fill the channel cutting regions CC again (in S7).

The etching of the memory layer may include removing at least one of the tunnel insulating layer, the charge storing layer, or the blocking insulating layer from between the vertical electrodes. For example, the etching of the memory layer may be performed to expose the sidewalls of the active patterns ACT, as shown in FIG. 20. In this case, the insulating gapfill layer may be formed to be in direct contact with the sidewalls of the active patterns. However, in other example embodiments, the etching of the memory layer may be performed such that there remains the tunnel insulating layer on the sidewalls of the vertical electrodes or such that there remains the tunnel insulating layer and the charge storing layer on the sidewalls of the vertical electrodes.

Figure 22:
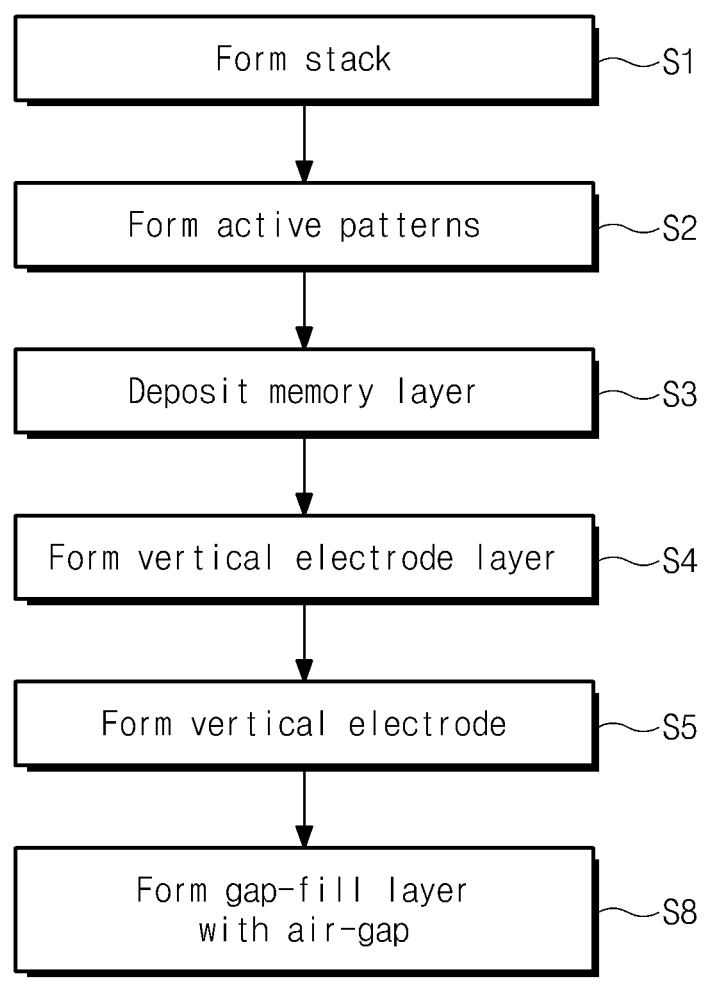
FIG. 22 is a flow chart illustrating a method of fabricating a three-dimensional semiconductor memory device, according to example embodiments of inventive concepts.
Figure 23:
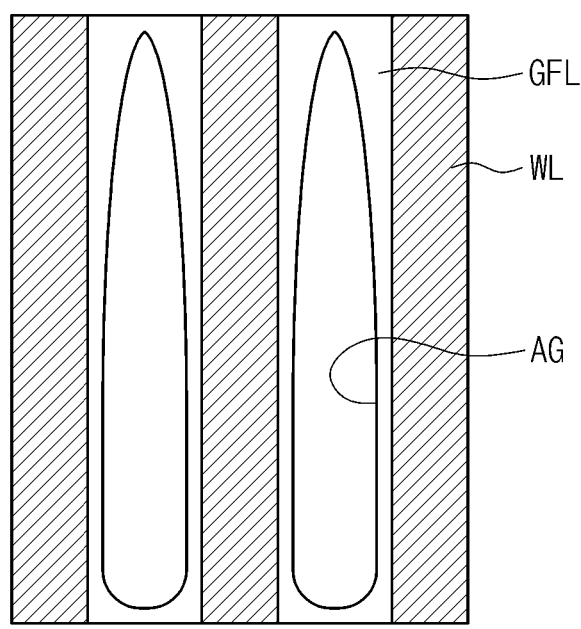
FIG. 23 is a sectional view illustrating a three-dimensional semiconductor memory device according to example embodiments of inventive concepts, which is fabricated using the fabrication method of FIG. 22.

FIG. 22 is a flow chart illustrating a method of fabricating a three-dimensional semiconductor memory device, according to example embodiments of inventive concepts, and FIG. 23 is a sectional view illustrating a three-dimensional semiconductor memory device according to example embodiments of inventive concepts, which is fabricated using the fabrication method of FIG. 22.

Referring to FIG. 22, after the formation of the vertical electrodes described with reference to FIG. 20, an insulating gapfill layer GFL may be formed between the vertical electrodes (in S8). According to example embodiments of inventive concepts, the insulating gapfill layer GFL may be formed to form an air-gap AG between the vertical electrodes (e.g., WL), as shown in FIG. 23. In example embodiments, the insulating gapfill layer GFL may include at least one of a silicon oxide layer or low-k dielectrics and may be formed using a deposition technique (e.g., a physical or chemical vapor deposition technique). The step-coverage property of the insulating gapfill layer GFL may be controlled to form the air-gap AG, during the deposition of the insulating gapfill layer GFL. In example embodiments, as previously described with reference to FIG. 19, the memory layer may be further patterned (in S6), before the formation of the insulating gapfill layer GFL.

Figure 24:
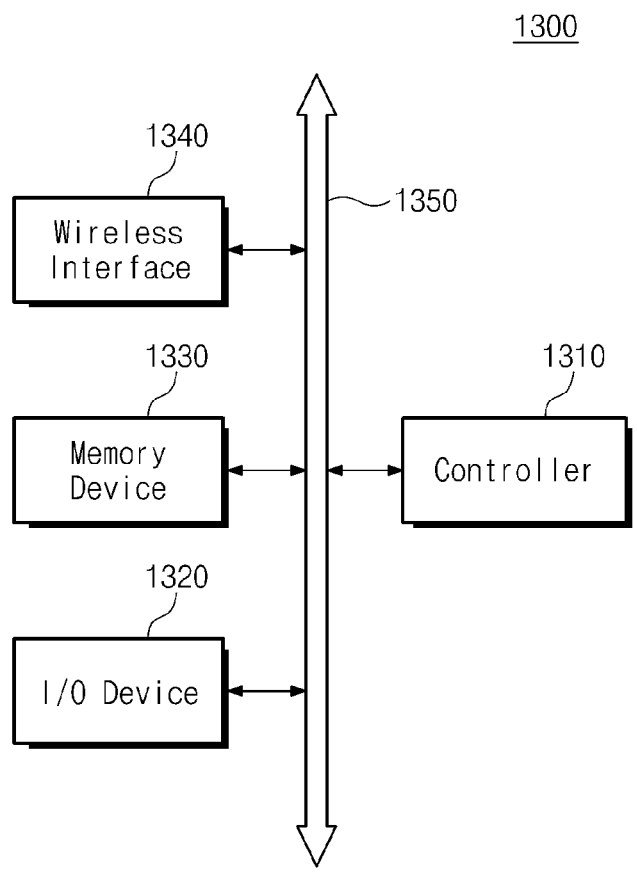
FIGS. 24 and 25 are block diagrams schematically illustrating electronic devices including a semiconductor device according to example embodiments of inventive concepts.
Figure 25:
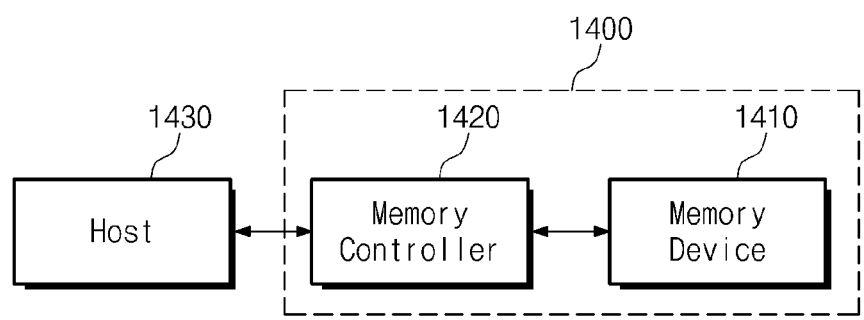

FIGS. 24 and 25 are block diagrams schematically illustrating electronic devices including a semiconductor device according to example embodiments of inventive concept.

Referring to FIG. 24, an electronic device 1300 including a semiconductor device according to example embodiments of inventive concepts may be used in one of a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 such as a keypad, a keyboard, a display, a memory 1330, and a wireless interface 1340 that are combined to each other through a bus 1350. The controller 1310 may include, for example, at least one microprocessor, a digital signal process, a microcontroller or the like. The memory 1330 may be configured to store a command code to be used by the controller 1310 or a user data. The memory 1330 may include a semiconductor device according to example embodiments of inventive concepts. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 25, a memory system including a semiconductor device according to example embodiments of inventive concepts will be described. The memory system 1400 may include a memory device 1410 for storing huge amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to example embodiments of inventive concepts.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi-chip package (MCP) technique, a wafer-level fabricated package (WFP) technique and a wafer-level processed stack package (WSP) technique.

The package in which a semiconductor memory device according to example embodiments may be mounted may further include at least one semiconductor device (e.g., a controller and/or a logic device) that is configured to control the semiconductor memory device.

According to example embodiments of inventive concepts, the string selection lines may be formed to be parallel to the bit lines. This makes it possible to increase a page depth of three-dimensional semiconductor memory device.

According to other example embodiments of inventive concepts, one of the word lines or the block selection line may be formed to have an extended portion. This makes it possible to reduce parasitic resistance of the active pattern.

According to example embodiments of inventive concepts, an air gap may be formed between the word lines. This makes it possible to limit (and/or suppress) a capacitive coupling from occurring between the word lines.

According to example embodiments of inventive concepts, a portion of the memory layer may be removed between the word lines. This makes it possible to improve a data retention property of the device.

While some example embodiments of inventive concepts have been particularly shown and described, it will be understood by one of ordinary skill in the art that variations in form and detail may be made therein without departing from the spirit and scope of the claims.

What is claimed is:

1. A three-dimensional semiconductor device, comprising:
   active patterns having a multi-layered and a multi-column structure;
   word lines having a multi-column structure, the word lines crossing the active patterns; and
   string selection gates configured to control columns of the active patterns, respectively,
   the string selection gates including first gates located at a first distance and second gates located at a second distance, the second distance being smaller than the first distance, when measured from a most adjacent one of the word lines that is located closest to the string selection gates,
   the most adjacent word line including a plurality of first extended portions extending toward the first gates,
   the word lines including other word lines that have a different shape than the most adjacent word line.

2. The device of claim 1, further comprising:
   a block selection line spaced apart from the most adjacent word line by the string selection gates,
   the block selection line including second extended portions protruding toward the second gates.

3. The device of claim 1, wherein the string selection gates are on the columns of the active patterns.

4. The device of claim 1, wherein the string selection gates are between the columns of the active patterns.

5. The device of claim 1, further comprising:
   a block selection line crossing the columns of the active patterns; and
   a ground selection line crossing the columns of the active patterns, wherein
   the ground selection line and the block selection line are spaced apart from each other,
   the word lines are between the block selection line and the ground selection line, and
   the string selection gates are arranged in a zig zag pattern between the block selection line and the most adjacent word line.

6. The device of claim 5, further comprising:
a drain diffusion region connected to one end of the active patterns; and
a source diffusion region connected to an other end of the active patterns, wherein
the first gates are closer to the drain diffusion region than the second gates.

7. The device of claim 1, further comprising:
a drain diffusion region connected to one end of the active patterns; and
a source diffusion region connected to an other end of the active patterns, wherein
the second gates are closer to the source diffusion region than the first gates.

8. The device of claim 1, further comprising:
a drain diffusion region connected to one end of the active patterns; and
a source diffusion region connected to an other end of the active patterns, wherein
the first extended portions of the most adjacent word line are closer to the drain diffusion region than a portion of the most adjacent word line that is between the plurality of first extended portions.

9. The device of claim 1, further comprising:
a drain diffusion region connected to one end of the active patterns; and
a source diffusion region connected to an other end of the active patterns, wherein
a structure of the most adjacent word line including the plurality of first extended portions is different than a structure of other word lines among the plurality of word lines such that the other word lines do not include extended portions.

10. A three-dimensional semiconductor device, comprising:
active patterns having a multi-layered and a multi-column structure;
word lines having a multi-column structure, the word lines being spaced apart from each other in a first direction, the word lines crossing the active patterns in a second direction that crosses the first direction, the word lines including a dummy word line and other word lines, the dummy word line including extended portions that extend the first direction from a first side of the dummy word line that is opposite a second side of the dummy word line, the extended portions of the dummy word line being spaced apart from each other in the second direction along the first side of the dummy word line; and
string selection gates configured to control columns of the active patterns, respectively,
the string selection gates including first gates and second gates that are spaced apart from each other,
the first gates being spaced apart a first distance in the first direction from the second side of the dummy word line such that the extended portions extend toward the first gates,
and the second gates being spaced apart a second distance from the second side of the dummy word line in the first direction,
the first distance being more the than the second distance.

11. The device of claim 10, further comprising:
a drain diffusion region connected to one end of the active patterns;
a source diffusion region connected to an other end of the active patterns, wherein
the drain diffusion region and the source diffusion region are spaced apart from each other in the first direction.

12. The device of claim 11, wherein the first gates are closer to the drain diffusion region than the second gates.

13. The device of claim 11, wherein the second gates are closer to the source diffusion region than the first gates.

14. The device of claim 11, wherein
the dummy word line is between the drain diffusion region and the other word lines, and
the extended portions extend toward the drain diffusion region.

15. The device of claim 11, wherein the string selection gates are between the dummy word line and the drain diffusion region.

16. The device of claim 10, wherein the first gates and the second gates are arranged in a zigzag pattern in a plan view.

17. The device of claim 10, wherein the string selection gates are between the columns of the active patterns.

18. The device of claim 10, wherein the string selection gates are on the columns of the active patterns.

* * * * *